US012768924B2

(12) United States Patent
Venkatraman et al.

(10) Patent No.: US 12,768,924 B2
(45) Date of Patent: Oct. 20, 2026

(54) AUTOMATED SELF TESTING OF AN ELECTRIC FIELD SENSING DEVICE

(71) Applicant: Caterpillar Inc., Peoria, IL (US)

(72) Inventors: Gowtham Venkatraman, Peoria, IL (US); Andrew Genseal, Chillicothe, IL (US); Justin Lee Steinlage, Mackinaw, IL (US); Jun Zuo, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 170 days.

(21) Appl. No.: 18/752,863

(22) Filed: Jun. 25, 2024

(65) Prior Publication Data

US 2025/0389803 A1 Dec. 25, 2025

(51) Int. Cl.
*G01R 35/00* (2006.01)
*G01R 19/165* (2006.01)
*G01R 29/12* (2006.01)

(52) U.S. Cl.
CPC ..... *G01R 35/007* (2013.01); *G01R 19/16528* (2013.01); *G01R 29/12* (2013.01)

(58) Field of Classification Search
CPC ..... G01R 29/085; G01R 29/12; G01R 31/007
See application file for complete search history.

(56) References Cited

U.S. PATENT DOCUMENTS 8,477,027 B2 * 7/2013 Givens ................. G01R 29/085 340/539.23
2010/0214094 A1 8/2010 Givens et al.
2014/0312883 A1 * 10/2014 Friedrich ............. G01R 35/005 324/202
2015/0102804 A1 4/2015 Heinrichs et al.
2016/0025785 A1 * 1/2016 Liu ........................ G01R 29/12 702/66
2019/0113557 A1 * 4/2019 Fang .................. G01R 29/0878
2019/0324065 A1 * 10/2019 Kalokitis ............. G01R 19/145

FOREIGN PATENT DOCUMENTS

| | | | |
|---|---|---|---|
| AU | 2018368813 | B2 | 8/2020 |
| CA | 2898761 | A1 | 1/2017 |
| CN | 102830383 | B | 2/2015 |
| CN | 105785301 | A | 7/2016 |
| CN | 106125028 | B | 12/2018 |
| CN | 109813972 | A | 5/2019 |
| CN | 116203328 | A | 6/2023 |
| WO | 2023166191 | A1 | 9/2023 |

OTHER PUBLICATIONS

Written Opinion and International Search Report for Int'l. Patent Appln. No. PCT/US2025/034472, mailed Oct. 22, 2025 (11 pgs).

* cited by examiner

*Primary Examiner* — Huy Q Phan
*Assistant Examiner* — Temilade S Rhodes-Vivour

(57) ABSTRACT

In some implementations, an automated self-testing system may include an electric field source and a controller. The controller may detect a trigger event associated with initiating a self test of an electric field sensing device. The controller may cause, based on the trigger event, the electric field source to create a target electric field at a specific location sensed by the electric field sensing device. The controller may receive measurement data indicating a measured electric field strength, detected by the electric field sensing device, of the target electric field. The controller may determine, based on the target electric field strength and the measured electric field strength, whether the electric field sensing device passes the self test or does not pass the self test.

20 Claims, 4 Drawing Sheets

AUTOMATED SELF TESTING OF AN ELECTRIC FIELD SENSING DEVICE

TECHNICAL FIELD

The present disclosure relates generally to automated self testing of an electric field sensing device, and, for example, to automated self testing of an electric field sensing device by creating, by an electric field source, a target electric field and confirming that the electric field sensing device detects the target electric field.

BACKGROUND

An electric field sensor (or electric field sensing device) may be used to detect parameters associated with an electric field (e.g., generated by an electric field source). A sensitivity of the electric field sensor determines its ability to detect changes in the electric field. The sensitivity of the electric field sensor is influenced by factors, such as electrode geometry, dielectric properties, and/or signal processing techniques, among other examples. Before deployment, the electric field sensor is calibrated to ensure accurate detection and reliable operation, which involves adjusting one or more electric field sensor settings and one or more threshold level to match a desired sensitivity and response characteristics of the electric field sensor.

In some cases, electric field sensors are mounted on a work machine that may be exposed to an electric field. For example, electric field sensors may be mounted on a boom, a stick, and a bucket of an excavator that may be exposed to an electric field generated by overhead power lines that are located near a work site of the excavator. Before the excavator is used to perform operations at the work site, an operator of the excavator must manually perform a test of each electric field sensor mounted on the excavator to confirm proper operation (e.g., to avoid arcing, among other examples).

Typically, the operator uses a handheld test wand to perform the test of each electric field sensor mounted on the excavator (e.g., for each electric field sensor mounted on the excavator, the operator holds the handheld wand approximately 100 millimeters from a face of each electric field sensor, presses and holds a button on the handheld test wand, and verifies that each electric field sensor detects an electric field generated by the handheld test wand). However, this manual test process has drawbacks and disadvantages, such as being inefficient (e.g., because the manual test process depends on human interaction) and reduces adoption of safety applications using electric field sensors (e.g., because the manual test process is burdensome to the operator of the excavator).

Chinese Patent Application Publication Number CN105785301A (301A publication) describes a rotary direct current (DC) electric field sensor automatic calibration system (calibration system). The calibration system includes a computer, a programmable DC power supply, an electric field generation device, and a data acquisition card. An output end of the computer is connected to the programmable DC power supply, and the computer is used for controlling an output voltage of the programmable DC power supply. An output end of the programmable DC power supply is connected to the electric field generation device, and the programmable DC power supply is used for providing voltage for the electric field generation device.

As further described by the '301A publication, a rotary DC electric field sensor is fixed on the electric field generation device, and the electric field generation device is used for providing a uniform electric field for the rotary DC electric field sensor. An input end of the data acquisition card is connected to an output end of the rotary DC electric field sensor, an output end of the data acquisition card is connected with the computer, and the data acquisition card is used for transferring output signals of the rotary DC electric field sensor to the computer. The uniform electric field is used to calibrate the rotary DC electric field sensor. Accordingly, the '301A publication does not address the drawbacks and disadvantages of having to perform a manual test process to confirm whether an electric field sensor is working properly (e.g., after calibration and before being used to detect a presence of voltage generated by an electric field located near a work site).

SUMMARY

Some implementations described herein relate to a system, comprising: an electric field source; and a controller configured to: detect a trigger event associated with initiating a self test of an electric field sensing device; cause, based on the trigger event, the electric field source to create a target electric field at a specific location sensed by the electric field sensing device; receive measurement data indicating a measured electric field strength, detected by the electric field sensing device, of the target electric field; determine, based on the target electric field strength and the measured electric field strength, whether the electric field sensing device passes the self test or does not pass the self test; and provide an indication of a result of the self test.

Some implementations herein relate to a method for automated self-testing of electric field sensing devices, the method comprising: detecting, by a controller, a trigger event associated with initiating a self test of an electric field sensing device; causing, by the controller and based on the trigger event, an electric field source to create a target electric field at a specific location sensed by the electric field sensing device; receiving, by the controller, measurement data indicating a measured electric field strength, detected by the electric field sensing device, of the target electric field; determining, by the controller and based on the target electric field strength and the measured electric field strength, whether the electric field sensing device passes the self test or does not pass the self test; and providing, by the controller, an indication of whether the electric field sensing device passes the self test or does not pass the self test.

Some implementations herein relate to a non-transitory computer-readable medium storing a set of instructions, the set of instructions comprising: one or more instructions that, when executed by one or more processors of a controller of an automated self-testing system, cause the controller to: detect a trigger event associated with initiating a self test of an electric field sensing device; cause, based on the trigger event, an electric field source to create a target electric field at a specific location sensed by the electric field sensing device; receive measurement data indicating a measured electric field strength, detected by the electric field sensing device, of the target electric field; determine and based on the target electric field strength and the measured electric field strength, whether the electric field sensing device passes the self test or does not pass the self test; and provide an indication of whether the electric field sensing device passes the self test or does not pass the self test.

DETAILED DESCRIPTION OF EXAMPLE EMBODIMENTS

The following detailed description of example implementations refers to the accompanying drawings. The same reference numbers in different drawings may identify the same or similar elements.

Figure 1:
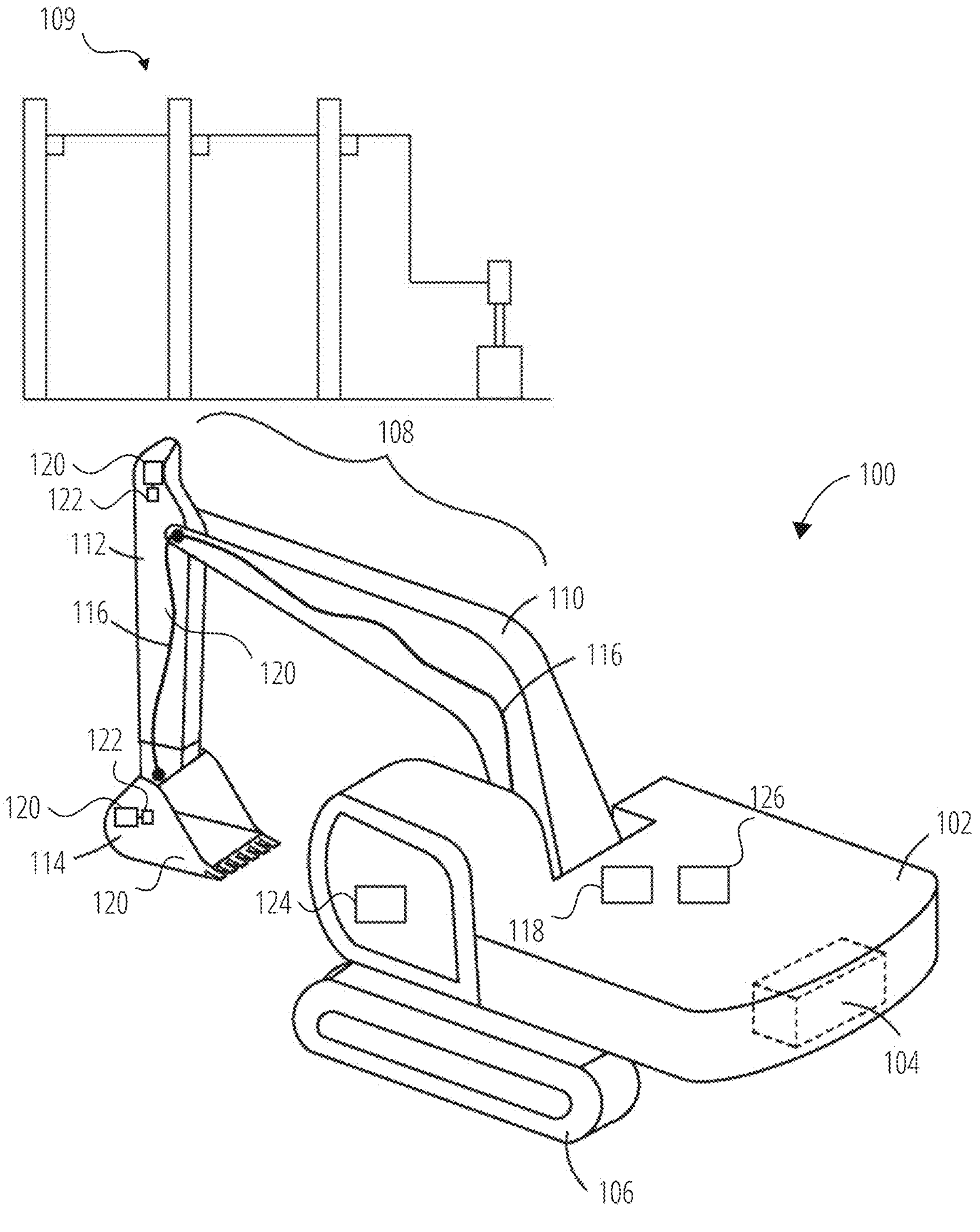
FIG. 1 is a diagram of an example machine described herein.

The present disclosure relates to automated self testing of an electric field sensing device (e.g., by creating, via an electric field source, a target electric field and confirming that the electric field sensing device detects the target electric field, as described in more detail elsewhere herein). FIG. 1 is a diagram of an example machine 100 described herein. As shown in FIG. 1, the machine 100 is embodied as an excavator. Although the machine 100 is embodied as an excavator, the machine 100 may be any suitable machine (e.g., a haul truck, a dozer, a loader, a backhoe, a motor grader, a wheel tractor scraper, and/or another earth moving machine, among other examples).

As further shown in FIG. 1, the machine 100 includes a frame 102 supporting an engine 104. The frame 102 is supported by ground-engaging elements (e.g., shown as tracks 106 in FIG. 1). Although the ground-engaging elements are shown as being tracks in FIG. 1, the ground-engaging elements may be any suitable ground-engaging elements (e.g., wheels, among other examples). The machine 100 includes a work tool assembly 108 (e.g., shown as including a boom 110, a stick 112, and a bucket 114 in FIG. 1, which are controlled via hydraulic lines 116 of a hydraulic system 118 of the machine 100). Although the work tool assembly 108 is shown as including the boom 110, the stick 112, and the bucket 114 in FIG. 1, the work tool assembly 108 may include any suitable components (e.g., a hydraulic thumb, an auger, a hammer, a compactor, a shear attachment, and/or a rock saw, among other examples). The work tool assembly 108 may be used to perform operations, such as operations at a work site (e.g., shown as a work site including an overhead power line system 109 in FIG. 1).

As further shown in FIG. 1, the machine 100 includes one or more electric field sensing devices 120, which may also be referred to herein singularly as electric field sensing device 120, one or more electric field sources 122, which may also be referred to herein singularly as electric field source 122, a controller 124 (e.g., an electronic control module ECM, among other examples), and a power source 126 (e.g., a battery, among other examples).

The power source 126 is operatively coupled to electric field sensing device 120, the electric field source 122, and/or the controller 124. In this way, the power source 126 may provide electrical power to the electric field sensing device 120, the electric field source 122, and/or the controller 124. The electric field source 122 may be integrated with the electric field sensing device 120 or may be separate from the electric field sensing device 120.

In some implementations, the electric field sensing device 120 detects a presence of an electric field created (or generated) by the electric field source 122. As an example, the electric field source 122 may be an alternating current (AC) electric field source. As another example, the electric field source 122 may be a direct current (DC) electric field source.

As further shown in FIG. 1, the one or more electric field sensing devices 120 are mounted at various locations of the machine 100. The one or more electric field sensing devices 120 may detect an electric field generated by the overhead power line system 109. The one or more electric field sensing devices 120 may send, and the controller 124 may receive, electric field information (e.g., one or more electric field parameters) related to the electric field generated by the overhead power line system 109. The controller 124 may process the information, as described in more detail elsewhere herein.

The electric field sensing device may be used to detect changes in an electric field strength surrounding the electric field sensing device, such as the electric field generated by the overhead power line system 109. When the electric field strength meets, or exceeds, a threshold (e.g., a voltage threshold associated with a distance, or proximity, to the overhead power line system 109), the electric field sensing device 120 generates an output signal (e.g., which may indicate voltage variations, changes in capacitance, and/or other measurable parameters that reflect a detected electric field strength).

The electric field sensing device 120 sends, and the controller 124 receives, the output signal. The controller 124 processes the output signal to determine a distance between the electric field sensing device 120 and the overhead power line system 109 (e.g., the controller 124 may compare the detected electric field signal strength to predefined thresholds and/or may use one or more distance calculating techniques to calculate the distance based on characteristics of the output signal). The controller 124 may perform one or more actions based on the distance between the electric field sensing device and the overhead power line system 109. As an example, the controller 124 may cause one or more safety measures to be triggered, such as by activating one or more visual and/or auditory alarms, providing one or more warnings to operators of the machine 100, and/or triggering automatic equipment shutdown procedures (e.g., to prevent accidents or injuries).

In some implementations, the controller 124 automatically causes a self test of the electric field sensing device 120 to be performed. As an example, the controller 124 may automatically cause initiation of the self test based on detecting a trigger event. As an example, the trigger event may be an operating condition of the machine 100 (e.g., a start-up operation of the machine 100, among other examples). Based on detecting the trigger event, the controller 124 may automatically cause the electric field source 122 to generate a target electric field (e.g., at a specific, or target, location sensed by the electric field sensing device and/or at a target, or specific, location in a range of the electric field sensing device, among other examples).

In some implementations, the target electric field may be based on a predetermined voltage range and/or a predetermined distance (e.g., a predetermine theoretical distance) between the electric field sensing device 120 and the electric field source 122, among other examples. As an example, the target electric field may be based on a scaled voltage representing a minimum voltage threshold and a scaled distance representing a minimum clearance distance corresponding to the minimum voltage threshold.

In this way, the controller 124 may automatically cause the electric field source 122 to generate electric fields that simulate other electric fields, such as electric fields generated by high-voltage power lines, among other examples. Furthermore, although the target electric field and the target electric field strength are described as being created based on at least one of a predetermined voltage range and/or the predetermined distance between the electric field sensing device 120 and the electric field source 122, the target electric field and/or the target electric field strength may be created in any suitable manner.

In some implementations, the controller 124 receives electric field information related to the target electric field (e.g., measurement data indicating a measured electric field strength, detected by the electric field sensing device 120, of the target electric field). The controller 124 determines, based on the target electric field strength and the measured electric field strength, whether the electric field sensing device passes the self test or does not pass the self test. As an example, the controller 124 may determine that the electric field sensing device 120 passes the self test based on the measured electric field strength meeting or exceeding a minimum threshold value (e.g., which may be a range of minimum electric field strength values) or does not pass the self test based on the measured electric field strength not meeting or exceeding the minimum threshold value.

In some implementations, the controller 124 provides an indication of a result of the self test. As an example, the controller 124 may cause a self-test report to be generated indicating a result of the self test (e.g., the result may indicate whether the electric field sensing device 120 passes, or does not pass, the self test, among other examples). The controller 124 may log results of the self tests of the electric field sensing device 120 over a time period. In this way, the controller 124 may generate a self test report enabling performance of the electric field sensing device 120 and/or a status (e.g., a current status) to be evaluated and/or determined over the time period. In some implementations, a minimum voltage level threshold, of a range of voltage levels of the target electric field, may be at least approximately 600 volts, among other examples.

Accordingly, in some implementations, the controller 124 may cause predetermined voltages, corresponding to predetermined distances, to be applied (e.g., via the electric field source 122) to the electric field sensing device 120 (e.g., the controller 124 may cycle through predetermined combinations of voltage and distance combinations). The electric field sensing device 120 may send, and the controller 124 may receive, readings from the electric field sensing device 120. The controller 124 may compare the readings to expected values (e.g., expected value ranges) for each of the readings received from the electric field sensing device 120. The controller 124 may determine whether the electric field sensing device 120 passes, or does not pass, the self test related to each of the voltages applied to the electric field sensing device 120. The controller 124 may repeat the self test procedure for each electric field sensing device 120 mounted on the machine 100. The controller 124 may perform one or more actions based on the results of the self tests (e.g., provide one or more visual and/or audible warnings and/or disallow use of the machine 100 until all electric field sensing devices 120 that do not pass the self tests are properly functioning or replaced, among other examples). The controller 124 may compile a report indicating results of the self tests, which may be sent to a different device (e.g., a server device that stores the results in a memory, among other examples. In this way, some implementations described herein enable automated self tests of electric field sensing devices 120 in an efficient and easy manner compared to manually performing the self tests of the electric field sensing devices 120.

As indicated above, FIG. 1 is provided as an example. Other examples may differ from what is described in connection with FIG. 1.

Figure 2:
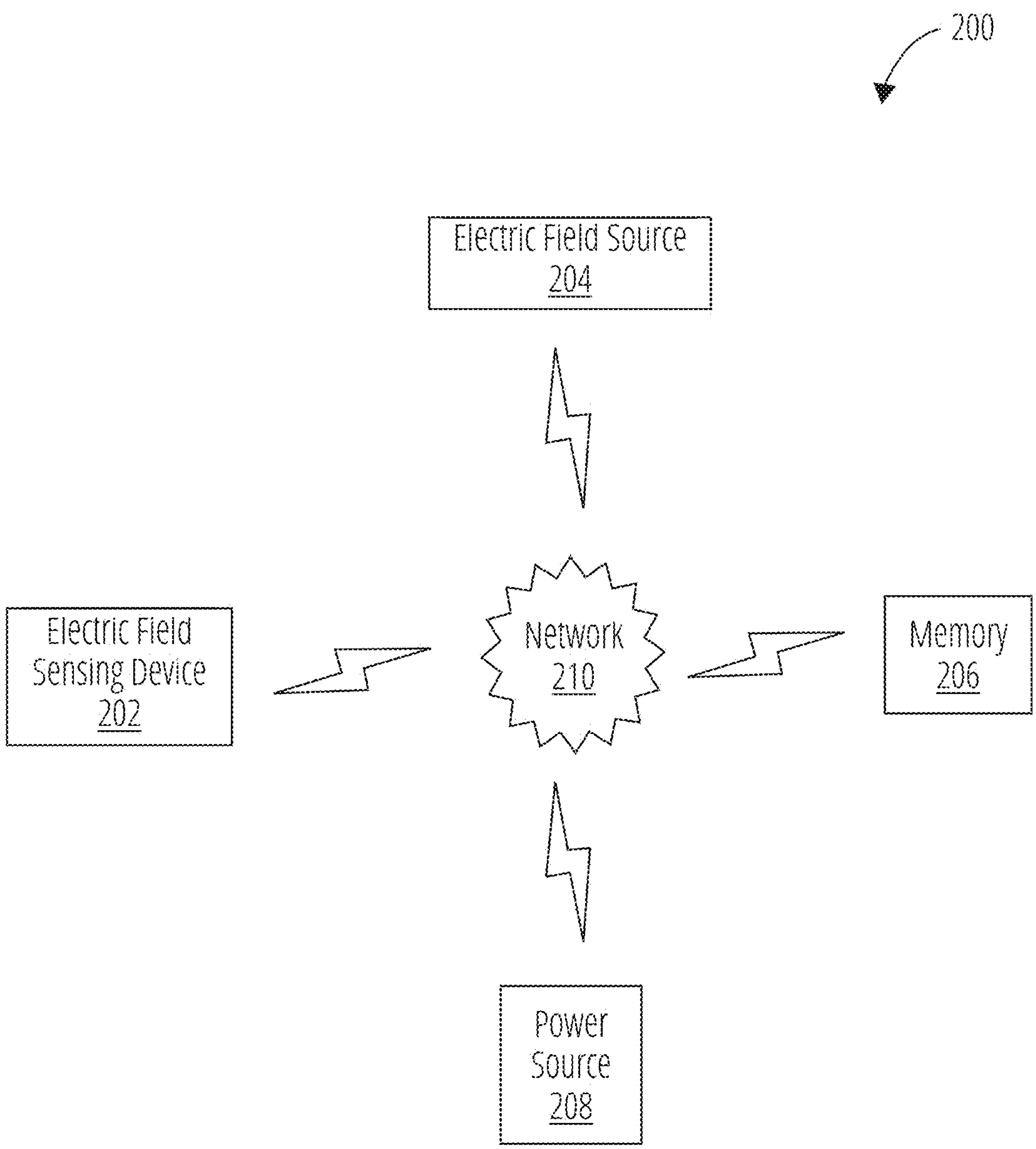
FIG. 2 is a diagram of an example environment in which systems and/or methods described herein may be implemented, in accordance with some embodiments of the present disclosure.

FIG. 2 is a diagram of an example environment 200 in which example devices and/or example methods, described herein, may be implemented. As shown in FIG. 2, the environment 200 includes an electric field sensing device 202 (e.g., which may correspond to electric field sensing device 120), an electric field source 204 (e.g., which may correspond to the electric field source 122), a controller 206 (e.g., which may correspond to the controller 124), a power source 208 (e.g., which may correspond to the power source 126), and a network 210. In some implementations, the electric field sensing device 202, the electric field source 204, the controller 206, the power source 208, and the network 210 may be used as an automated self testing system (e.g., of the electric field sensing device 202). In some implementations, the electric field sensing device 202 may be separate from the electric field source 204 and the controller 206. In some other implementations, the electric field source 204 and the controller 206 are integrated into the electric field sensing device 202 enabling the electric field sensing device 202 to have a self-test functionality.

The electric field sensing device 202 may be any suitable electric field sensing device. As an example, the electric field sensing device 202 may be a voltage proximity alarm (e.g., a high-voltage proximity alarm), an electric field meter, a capacitive proximity sensors, an electric field imaging sensor (e.g., associated with an electric field imaging sensor system), an electric field strength detector, a dielectric spectroscopy sensor, an electric field antenna, an electric field strength monitor, and/or an electric field probe, among other examples.

The electric field source 204 may be any suitable electric field source. As an example, the electric field source may be a high-voltage AC source, a low-voltage AC source, a high-voltage DC source, and/or a low voltage DC source. The controller 206 may be any suitable controller, such as an ECM, a human-machine interface (HMI) and/or a central processing unit (CPU) among other examples).

The power source 208 may be an electric power source, such as a battery, among other examples. The power source 208 provides electric power (e.g., via an electric power output) to the electric field sensing device 202, the electric field source 204, and/or the controller 206 (e.g., the power source 208 may provide a stable and controlled electrical voltage to the electric field sensing device 202, the electric field source 204, and/or the controller 206). In some implementations, the power source 208 may be a battery equipped on a work machine (e.g., the machine 100 of FIG. 1) and/or an external power source, such as an external generator, powerline, and/or power grid, among other examples, electrically coupled to the machine (e.g., the machine may be a tethered machine).

The electric power may be distributed through a circuit or electric system to provide the electrical power output to the electric field sensing device 202, the electric field source 204, and/or the controller 206 (e.g., the circuit or electric system may include switches, relays, and/or control circuits, among other examples, to manage a flow of electricity from the power source 208 to the electric field sensing device 202, the electric field source 204, and/or the controller 206).

The controller 206 may be communicatively coupled to the electric field sensing device 202 and/or the electric field source 204 via a wired or wireless network, such as the network 210. The electric field sensing device 202 may detect and/or measure electric field information associated with an electric field generated by the electric field source 204 (e.g., the target electric field, generated by the electric field source 122 of FIG. 1, at a specific location sensed by the electric field sensing device), as described in more detail elsewhere herein.

The network 210 may include one or more wired and/or wireless networks. For example, the network 210 may include a wireless wide area network (e.g., a cellular network or a public land mobile network), a local area network (e.g., a wired local area network or a wireless local area network (WLAN), such as a Wi-Fi network), a personal area network (e.g., a Bluetooth network), a near-field communication network, a telephone network, a private network, the Internet, and/or a combination of these or other types of networks. The network 210 enables communication among the devices of environment 200.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3:
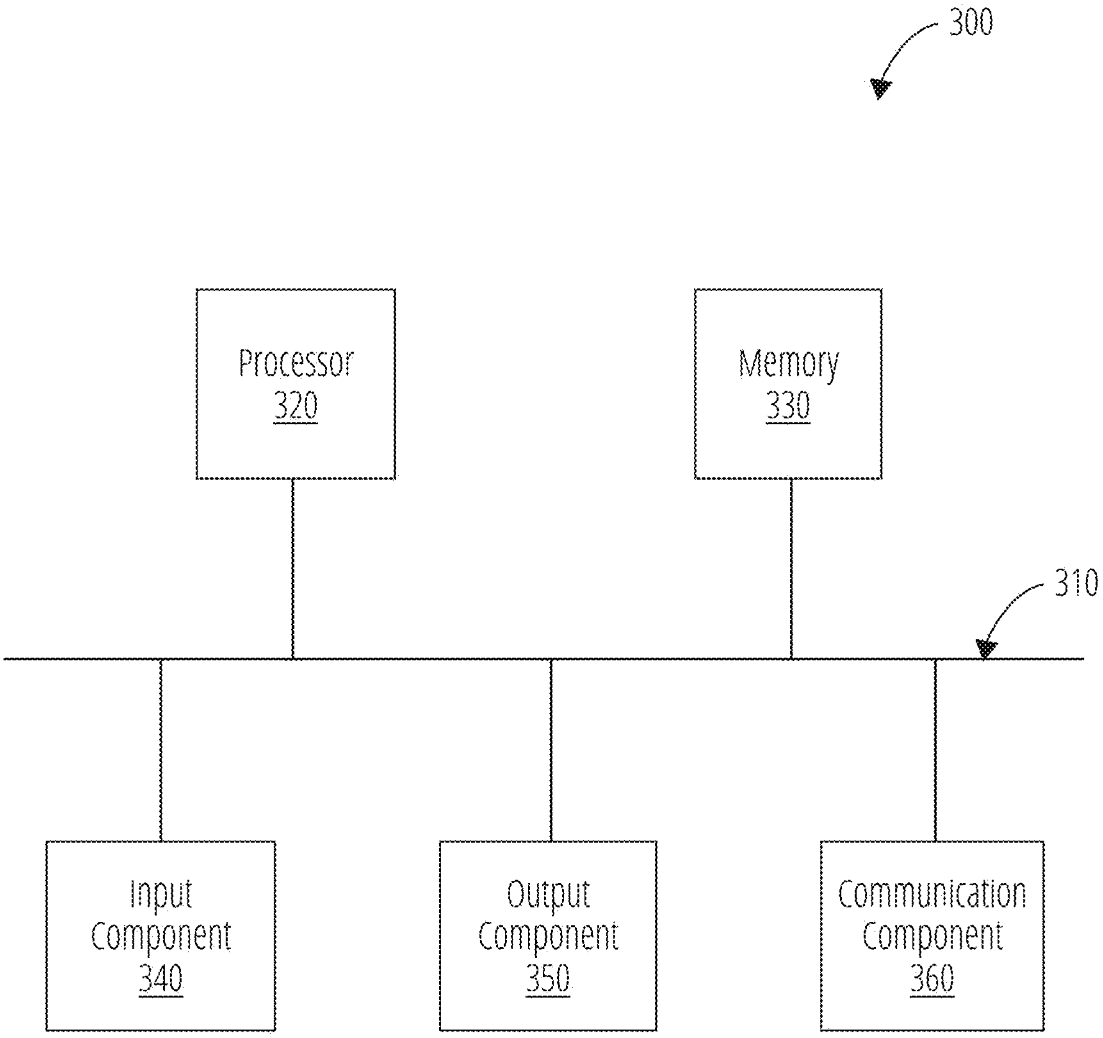
FIG. 3 is a diagram of example components of a device associated with automated self testing of an electric field sensing device, according to some embodiments of the present disclosure.

FIG. 3 is a diagram of example components of a device 300 associated with automated self testing of an electric field sensing device. The device 300 may correspond to an electric field sensing device (e.g., the electric field sensing device 120 and/or the electric field sensing device 202), an electric field source (e.g., the electric field source 122 and/or the electric field source 204), a controller (e.g., the controller 124 and/or the controller 206), and/or a power source (e.g., the power source 126 and/or the power source 208). In some implementations, the electric field sensing device (e.g., the electric field sensing device 120 and/or the electric field sensing device 202), the electric field source (e.g., the electric field source 122 and/or the electric field source 204), the controller (e.g., the controller 124 and/or the controller 206), and/or the power source (e.g., the power source 126 and/or the power source 208) may include one or more devices 300 and/or one or more components of the device 300. As shown in FIG. 3, the device 300 may include a bus 310, a processor 320, a memory 330, an input component 340, an output component 350, and/or a communication component 360.

The bus 310 may include one or more components that enable wired and/or wireless communication among the components of the device 300. The bus 310 may couple together two or more components of FIG. 3, such as via operative coupling, communicative coupling, electronic coupling, and/or electric coupling. For example, the bus 310 may include an electrical connection (e.g., a wire, a trace, and/or a lead) and/or a wireless bus. The processor 320 may include a central processing unit, a graphics processing unit, a microprocessor, a controller, a microcontroller, a digital signal processor, a field-programmable gate array, an application-specific integrated circuit, and/or another type of processing component. The processor 320 may be implemented in hardware, firmware, or a combination of hardware and software. In some implementations, the processor 320 may include one or more processors capable of being programmed to perform one or more operations or processes described elsewhere herein.

The memory 330 may include volatile and/or nonvolatile memory. For example, the memory 330 may include random access memory (RAM), read only memory (ROM), a hard disk drive, and/or another type of memory (e.g., a flash memory, a magnetic memory, and/or an optical memory). The memory 330 may include internal memory (e.g., RAM, ROM, or a hard disk drive) and/or removable memory (e.g., removable via a universal serial bus connection). The memory 330 may be a non-transitory computer-readable medium. The memory 330 may store information, one or more instructions, and/or software (e.g., one or more software applications) related to the operation of the device 300. In some implementations, the memory 330 may include one or more memories that are coupled (e.g., communicatively coupled) to one or more processors (e.g., processor 320), such as via the bus 310. Communicative coupling between a processor 320 and a memory 330 may enable the processor 320 to read and/or process information stored in the memory 330 and/or to store information in the memory 330.

The input component 340 may enable the device 300 to receive input, such as user input and/or sensed input. For example, the input component 340 may include a touch screen, a keyboard, a keypad, a mouse, a button, a microphone, a switch, a sensor, a global positioning system sensor, an accelerometer, a gyroscope, and/or an actuator. The output component 350 may enable the device 300 to provide output, such as via a display, a speaker, and/or a light-emitting diode. The communication component 360 may enable the device 300 to communicate with other devices via a wired connection and/or a wireless connection. For example, the communication component 360 may include a receiver, a transmitter, a transceiver, a modem, a network interface card, and/or an antenna.

The device 300 may perform one or more operations or processes described herein. For example, a non-transitory computer-readable medium (e.g., memory 330) may store a set of instructions (e.g., one or more instructions or code) for execution by the processor 320. The processor 320 may execute the set of instructions to perform one or more operations or processes described herein. In some implementations, execution of the set of instructions, by one or more processors 320, causes the one or more processors 320 and/or the device 300 to perform one or more operations or processes described herein. In some implementations, hardwired circuitry may be used instead of or in combination with the instructions to perform one or more operations or processes described herein. Additionally, or alternatively, the processor 320 may be configured to perform one or more operations or processes described herein. Thus, implementations described herein are not limited to any specific combination of hardware circuitry and software.

The number and arrangement of components shown in FIG. 3 are provided as an example. The device 300 may include additional components, fewer components, different components, or differently arranged components than those shown in FIG. 3. Additionally, or alternatively, a set of components (e.g., one or more components) of the device 300 may perform one or more functions described as being performed by another set of components of the device 300.

INDUSTRIAL APPLICABILITY

As noted above, the disclosed subject matter relates to automated self testing of an electric field sensing device (e.g., by creating, via an electric field source, a target electric field and confirming that the electric field sensing device detects the target electric field, as described in more detail elsewhere herein). In this way, some implementations described herein enable automated self tests of electric field sensing devices in an efficient and easy manner compared to manually performing the self tests of the electric field sensing devices.

Figure 4:
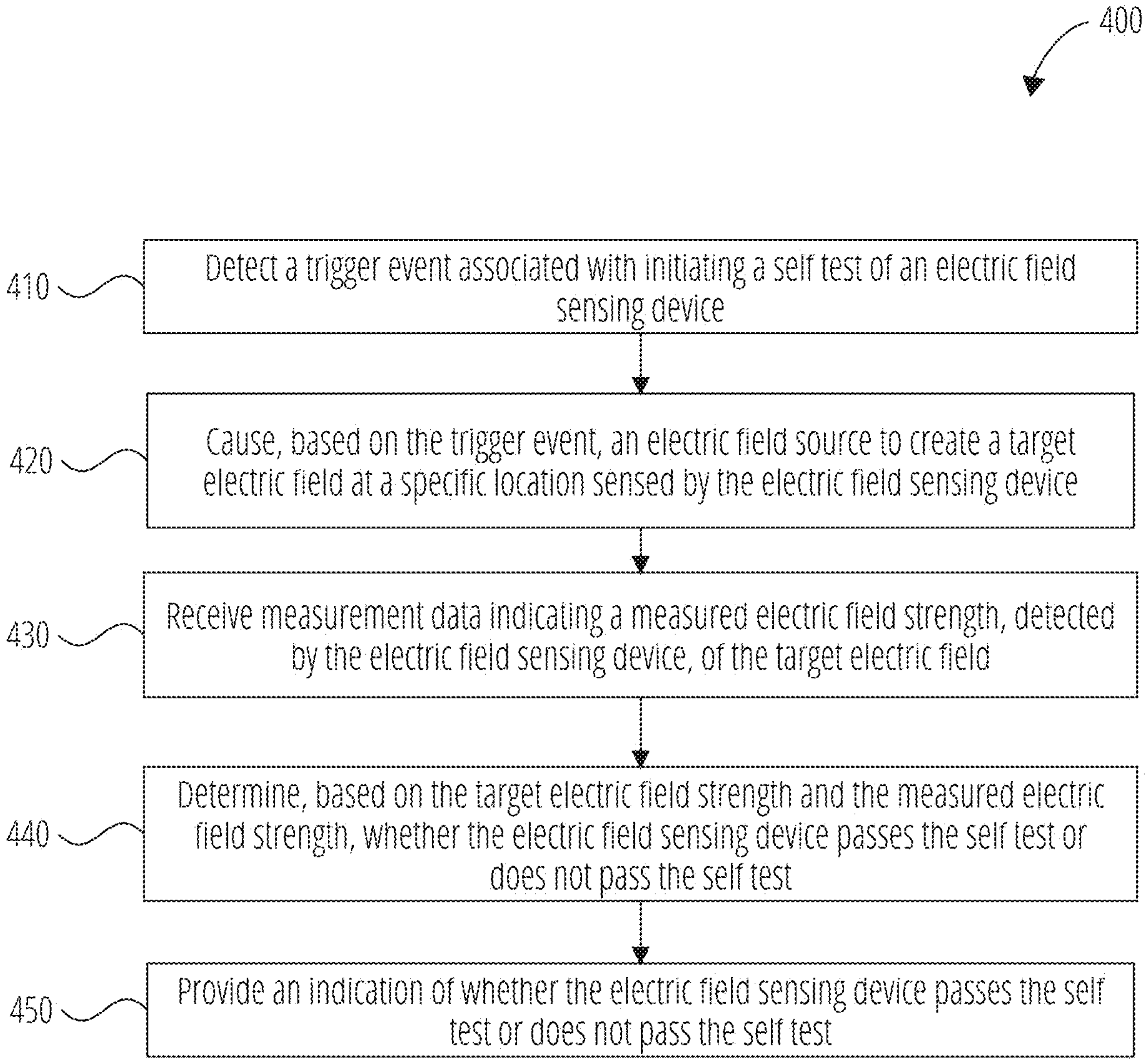
FIG. 4 is a flowchart of an example process associated with automated self testing of an electric field sensing device, in accordance with some embodiments of the present disclosure.

FIG. 4 is a flowchart of an example process 400 associated with automated self testing of an electric field sensing device (e.g., by creating, via an electric field source, a target electric field and confirming that the electric field sensing device detects the target electric field, as described in more detail elsewhere herein). In some implementations, one or more process blocks of FIG. 4 may be performed by a controller (e.g., the controller 124 and/or the controller 206) of a machine (e.g., the machine 100). In some implementations, one or more process blocks of FIG. 4 may be performed by another device, or a group of devices, separate from or including the controller, such as one or more components of the work machine, as described in more detail elsewhere herein.

As shown in FIG. 4, the process 400 includes detecting a trigger event associated with initiating a self test of an electric field sensing device (block 410). As an example, a controller may detect a trigger event associated with initiating a self test of an electric field sensing device, as described in more detail elsewhere herein.

As further shown in FIG. 4, the process 400 includes causing, based on the trigger event, an electric field source to create a target electric field at a specific location sensed by the electric field sensing device (block 420). For example, the controller may cause, based on the trigger event, an electric field source to create a target electric field at a specific location of the electric field sensing device, as described in more detail elsewhere herein.

As further shown in FIG. 4, the process 400 includes receiving measurement data indicating a measured electric field strength, detected by the electric field sensing device, of the target electric field (block 430). For example, the controller may receive measurement data indicating a measured electric field strength, detected by the electric field sensing device, of the target electric field, as described in more detail elsewhere herein.

As further shown in FIG. 4, the process 400 determining, based on the target electric field strength and the measured electric field strength, whether the electric field sensing device passes the self test or does not pass the self test (block 440). For example, the controller may Determine, based on the target electric field strength and the measured electric field strength, whether the electric field sensing device passes the self test or does not pass the self test, as described in more detail elsewhere herein.

As further shown in FIG. 4, the process 400 includes providing an indication of whether the electric field sensing device passes the self test or does not pass the self test (block 450). For example, the controller may provide an indication of whether the electric field sensing device passes the self test or does not pass the self test, as described in more detail elsewhere herein.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Embodiments of the disclosed subject matter can also be as set forth according to the following parentheticals.

(1) A system, comprising: an electric field source; and a controller configured to: detect a trigger event associated with initiating a self test of an electric field sensing device; cause, based on the trigger event, the electric field source to create a target electric field at a specific location sensed by the electric field sensing device; receive measurement data indicating a measured electric field strength, detected by the electric field sensing device, of the target electric field; determine, based on the target electric field strength and the measured electric field strength, whether the electric field sensing device passes the self test or does not pass the self test; and provide an indication of a result of the self test.

(2) The system according to (1), wherein the controller is configured to: determine that the electric field sensing device: passes the self test based on at least one of: the measured electric field strength meeting or exceeding a minimum threshold value, or the measured electric field strength being within a predetermined range of electric field strength values related to the target electric field, or does not pass the self test based on at least one of: the measured electric field strength not meeting or exceeding the minimum threshold value, or the measured electric field strength not being within the predetermined range of values related to the target electric field.

(3) The system according to any one of (1) to (2), wherein the target electric field strength is created based on at least one of: a predetermined voltage range, or a predetermined distance between the electric field sensing device and the electric field source.

(4) The system according to any one of (1) to (3), wherein the target electric field is based on a scaled voltage representing a minimum voltage threshold and a scaled distance representing a minimum clearance distance corresponding to the minimum voltage threshold.

(5) The system according to any one of (1) to (4), wherein the self test of the electric field sensing device target electric field is a first self test of the electric field sensing device, of multiple self tests of the electric field sensing device, performed during a time period, and wherein the controller is configured to: generate a report indicating results of the multiple self tests during the time period.

(6) The system according to any one of (1) to (5), wherein the electric field source and the controller are integrated into the electric field sensing device enabling the electric field sensing device to have a self-test functionality.

(7) The system according to any one of (1) to (6), wherein the electric field sensing device is coupled to a machine.

(8) A method for automated self-testing of electric field sensing devices, the method comprising: detecting, by a controller, a trigger event associated with initiating a self test of an electric field sensing device; causing, by the controller and based on the trigger event, an electric field source to create a target electric field at a specific location sensed by the electric field sensing device; receiving, by the controller, measurement data indicating a measured electric field strength, detected by the electric field sensing device, of the target electric field; determining, by the controller and based on the target electric field strength and the measured electric field strength, whether the electric field sensing device passes the self test or does not pass the self test; and providing, by the controller, an indication of whether the electric field sensing device passes the self test or does not pass the self test.

(9) The method according to (8), wherein the indication is an alarm indication based on the electric field sensing device not passing the self test.

(10) The method according to any one of (8) to (9), wherein the electric field sensing device is mounted on a machine, and wherein the method further comprises: preventing an operation of the machine from being performed based on the electric field sensing device not passing the self test.

(11) The method according to any one of (8) to (10), wherein the target electric field strength is created based on at least one of: a predetermined voltage range, or a predetermined distance between the electric field sensing device and the electric field source.

(12) The method according to any one of (8) to (11), wherein the target electric field is based on a scaled voltage representing a minimum voltage threshold and a scaled distance representing a minimum clearance distance corresponding to the minimum voltage threshold.

(13) The method according to any one of (8) to (12), wherein the electric field source and the controller are integrated into the electric field sensing device enabling the electric field sensing device to have a self-test functionality.

(14) The method according to any one of (8) to (13), further comprising: causing, by the controller, a report to be generated indicating results of multiple self tests during a time period.

(15) A non-transitory computer-readable medium storing a set of instructions, the set of instructions comprising: one or more instructions that, when executed by one or more processors of a controller of an automated self-testing system, cause the controller to: detect a trigger event associated with initiating a self test of an electric field sensing device; cause, based on the trigger event, an electric field source to create a target electric field at a specific location sensed by the electric field sensing device; receive measurement data indicating a measured electric field strength, detected by the electric field sensing device, of the target electric field; determine and based on the target electric field strength and the measured electric field strength, whether the electric field sensing device passes the self test or does not pass the self test; and provide an indication of whether the electric field sensing device passes the self test or does not pass the self test.

(16) The non-transitory computer-readable medium according to (15), wherein the one or more instructions, when executed by the one or more processors of the controller of the automated self-testing system, cause the controller to: determine that the electric field sensing device: passes the self test based on at least one of: the measured electric field strength meeting or exceeding a minimum threshold value, or the measured electric field strength being within a predetermined range of electric field strength values related to the target electric field, or does not pass the self test based on at least one of: the measured electric field strength not meeting or exceeding the minimum threshold value, or the measured electric field strength not being within the predetermined range of values related to the target electric field.

(17) The non-transitory computer-readable medium according to any one of (15) to (16), wherein the target electric field strength is created based on at least one of: a predetermined voltage range, or a predetermined distance between the electric field sensing device and the electric field source.

(18) The non-transitory computer-readable medium according to any one of (15) to (17), wherein the target electric field is based on a scaled voltage representing a minimum voltage threshold and a scaled distance representing a minimum clearance distance corresponding to the minimum voltage threshold.

(19) The non-transitory computer-readable medium according to any one of (15) to (18), wherein the self test of the electric field sensing device target electric field is a first self test of the electric field sensing device, of multiple self tests of the electric field sensing device, performed during a time period, and wherein the controller is configured to: generate a report indicating results of the multiple self tests during the time period.

(20) The non-transitory computer-readable medium according to any one of (15) to (19), wherein the electric field source and the controller are integrated into the electric field sensing device enabling the electric field sensing device to have a self-test functionality.

As used herein, the term "component" is intended to be broadly construed as hardware, firmware, or a combination of hardware and software. It will be apparent that systems and/or methods described herein may be implemented in different forms of hardware, firmware, and/or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be used to implement the systems and/or methods based on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

When "a processor" or "one or more processors" (or another device or component, such as "a controller" or "one or more controllers") is described or claimed (within a single claim or across multiple claims) as performing multiple operations or being configured to perform multiple operations, this language is intended to broadly cover a variety of processor architectures and environments. For example, unless explicitly claimed otherwise (e.g., via the use of "first processor" and "second processor" or other language that differentiates processors in the claims), this language is intended to cover a single processor performing or being configured to perform all of the operations, a group of processors collectively performing or being configured to perform all of the operations, a first processor performing or being configured to perform a first operation and a second processor performing or being configured to perform a second operation, or any combination of processors performing or being configured to perform the operations. For example, when a claim has the form "one or more processors configured to: perform X; perform Y; and perform Z," that claim should be interpreted to mean "one or more processors configured to perform X; one or more (possibly different) processors configured to perform Y; and one or more (also possibly different) processors configured to perform Z."

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

In the preceding specification, various example embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A system associated with a machine configured to traverse an area having a high-voltage power line, comprising:

an electric field source; and a controller configured to:

detect a trigger event to initiate a self test of an electric field sensing device, the trigger event to initiate the self test of the electric field sensing device being based on determination of a distance between the electric field sensing device and the high-voltage power line relative to a predetermined minimum clearance distance;

responsive to the trigger event being detected and with the electric field sensing device being at the determined distance from the high-voltage power line, initiate the self test of the electric field sensing device, the self test including:

cause, based on the trigger event to initiate the self test of the electric field sensing device, the electric field source to create a target electric field at a specific location sensed by the electric field sensing device, the target electric field being created to simulate one or more electric fields associated with the high-voltage power line;

receive measurement data indicating a measured electric field strength, detected by the electric field sensing device, of the target electric field; and determine, based on target electric field strength of the created target electric field and the measured electric field strength, whether the electric field sensing device passes the self test or does not pass the self test;

provide an indication of a result of the self test; and with the electric field sensing device being at the determined distance from the high-voltage power line, prevent an operation of the machine from being performed responsive to the electric field sensing device not passing the self test.

2. The system of claim 1, wherein the controller is configured to:

determine that the electric field sensing device:

passes the self test based on at least one of:

the measured electric field strength meeting or exceeding a minimum threshold value, or the measured electric field strength being within a predetermined range of electric field strength values related to the target electric field, or does not pass the self test based on at least one of:

the measured electric field strength not meeting or exceeding the minimum threshold value, or the measured electric field strength not being within the predetermined range of values related to the target electric field.

3. The system of claim 1, wherein the target electric field strength is created based on at least one of:

a predetermined voltage range, or a predetermined distance between the electric field sensing device and the electric field source.

4. The system of claim 1, wherein the target electric field is based on a scaled voltage representing a minimum voltage threshold and a scaled distance representing the predetermined minimum clearance distance, and wherein the predetermined minimum clearance distance corresponds to the minimum voltage threshold.

5. The system of claim 1, wherein the self test of the electric field sensing device target electric field is a first self test of the electric field sensing device, of multiple self tests of the electric field sensing device, performed during a time period, and wherein the controller is configured to:

generate a report indicating results of the multiple self tests during the time period.

6. The system of claim 1, wherein the electric field source and the controller are integrated into the electric field sensing device enabling the electric field sensing device to have a self-test functionality.

7. The system of claim 1, wherein the electric field sensing device is coupled to a machine.

8. A method for automated self-testing of an electric field sensing device mounted on a machine configured to traverse an area having a high-voltage power line, the method comprising:

detecting, by a controller, a trigger event to initiate a self test of an electric field sensing device, the trigger event to initiate the self test of the electric field sensing device being based on determination of a distance between the electric field sensing device and the high-voltage power line relative to a predetermined minimum clearance distance;

responsive to the trigger event being detected and with the electric field sensing device being at the determined distance from the high-voltage power line, initiate the self test of the electric field sensing device, the self test including:

causing, by the controller and based on the trigger event to initiate the self test of the electric field sensing device, an electric field source to create a target electric field at a specific location sensed by the electric field sensing device, the target electric field being created to simulate one or more electric fields associated with the high-voltage power line;

receiving, by the controller, measurement data indicating a measured electric field strength, detected by the electric field sensing device, of the target electric field; and determining, by the controller and based on the target electric field strength of the created target electric field and the measured electric field strength, whether the electric field sensing device passes the self test or does not pass the self test; and providing, by the controller, an indication of whether the electric field sensing device passes the self test or does not pass the self test with the electric field sensing device at the determined distance from the high-voltage power line, preventing, by the controller, an operation of the machine from being performed based on the electric field sensing device not passing the self test.

9. The method of claim 8, wherein the indication is an alarm indication based on the electric field sensing device not passing the self test.

10. The method of claim 8, wherein the target electric field strength is created based on at least one of:

a predetermined voltage range, or a predetermined distance between the electric field sensing device and the electric field source.

11. The method of claim 8, wherein the target electric field is based on a scaled voltage representing a minimum voltage threshold and a scaled distance representing a minimum clearance distance corresponding to the minimum voltage threshold.

12. The method of claim 8, wherein the electric field source and the controller are integrated into the electric field sensing device enabling the electric field sensing device to have a self-test functionality.

13. The method of claim 8, further comprising:

causing, by the controller, a report to be generated indicating results of multiple self tests during a time period.

14. A non-transitory computer-readable medium storing a set of instructions, the set of instructions comprising:

one or more instructions that, when executed by one or more processors of a controller of an automated self-testing system associated with a machine configured to traverse an area having a high-voltage power line, cause the controller to:

detect a trigger event associated with initiating a self test of an electric field sensor, the trigger event to initiate the self test of the electric field sensor being based on determination of a distance between the electric field sensor and the high-voltage power line relative to a predetermined minimum clearance distance;

responsive to the trigger event being detected and with the electric field sensor being at the determined distance from the high-voltage power line, initiate the self test of the electric field sensor, the self test including:

cause, based on the trigger event, an electric field source to create a target electric field sensed by the electric field sensor, the target electric field being created to simulate one or more electric fields associated with the high-voltage power line;

receive measurement data indicating a measured electric field strength, detected by the electric field sensor, of the target electric field; and determine and based on the target electric field strength of the created target electric field and the measured electric field strength, whether the electric field sensor passes the self test or does not pass the self test; and provide an indication of whether the electric field sensor passes the self test or does not pass the self test.

15. The non-transitory computer-readable medium of claim 14, wherein the one or more instructions, when executed by the one or more processors of the controller of the automated self-testing system, cause the controller to:

determine that the electric field sensor:

passes the self test based on at least one of:

the measured electric field strength meeting or exceeding a minimum threshold value, or the measured electric field strength being within a predetermined range of electric field strength values related to the target electric field, or does not pass the self test based on at least one of:

the measured electric field strength not meeting or exceeding the minimum threshold value, or the measured electric field strength not being within the predetermined range of values related to the target electric field.

16. The non-transitory computer-readable medium of claim 14, wherein the target electric field strength is further created based on a predetermined voltage range.

17. The non-transitory computer-readable medium of claim 14, wherein the target electric field is based on a scaled voltage representing a minimum voltage threshold and a scaled distance representing the predetermined minimum clearance distance, and wherein the predetermined minimum clearance distance corresponds to the minimum voltage threshold.

18. The non-transitory computer-readable medium of claim 14, wherein the self test of the electric field sensor is a first self test of the electric field sensor, of multiple self tests of the electric field sensor, performed during a time period, and wherein the controller is configured to:

generate a report indicating results of the multiple self tests during the time period.

19. The non-transitory computer-readable medium of claim 14, wherein the electric field source and the controller are integrated into the electric field sensor enabling the electric field sensor to have a self-test functionality.

20. The non-transitory computer-readable medium of claim 14, wherein, with the electric field sensor at the determined distance from the high-voltage power line, disallow use of the machine until the electric field sensor passes the self test.

* * * * *